(12) United States Patent
Takeda

(10) Patent No.: US 7,564,112 B2
(45) Date of Patent: Jul. 21, 2009

(54) SEMICONDUCTOR DEVICE, RADIOGRAPHIC IMAGING APPARATUS, AND METHOD FOR MANUFACTURING THE SAME

(75) Inventor: Shinichi Takeda, Saitama-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 218 days.

(21) Appl. No.: 11/286,389

(22) Filed: Nov. 25, 2005

(65) Prior Publication Data

US 2006/0108683 A1   May 25, 2006

(30) Foreign Application Priority Data

Nov. 24, 2004   (JP)   ............................ 2004-338929

(51) Int. Cl.
 *H01L 29/00*   (2006.01)
(52) U.S. Cl. ..................................... 257/433
(58) Field of Classification Search ................ 438/117, 438/64; 257/724, 784, 433; 250/370.09, 250/370.01, 370.08
See application file for complete search history.

(56) References Cited

U.S. PATENT DOCUMENTS

| | | | | |
|---|---|---|---|---|
| 6,025,598 A | * | 2/2000 | Tago | 250/370.01 |
| 6,825,472 B2 | * | 11/2004 | Endo | 250/370.09 |
| 2002/0005490 A1 | * | 1/2002 | Watanabe | 250/370.09 |
| 2003/0214028 A1 | * | 11/2003 | Brechignac et al. | 257/706 |

* cited by examiner

*Primary Examiner*—David A Zarneke
*Assistant Examiner*—Jenny L Wagner
(74) *Attorney, Agent, or Firm*—Fitzpatrick, Cella, Harper & Scinto

(57) ABSTRACT

A semiconductor device or a radiographic imaging apparatus includes a substrate and a supporting member, the substrate having a semiconductor element or a conversion element and being bonded to the supporting member with a laminating member. The semiconductor device or the radiographic imaging apparatus further includes at least one cushioning member in at least one space between the substrate and the supporting member at least in a region including an electrical connection portion connected to at least one electrical component. Thus, when a malfunction or a defect is found in the at least one electrical component, such as TCP, on the periphery of the substrate, the defective electrical component can easily be replaced.

12 Claims, 6 Drawing Sheets

SEMICONDUCTOR DEVICE, RADIOGRAPHIC IMAGING APPARATUS, AND METHOD FOR MANUFACTURING THE SAME

BACKGROUND OF THE INVENTION

1. Field of the Invention

The present invention relates to a radiographic imaging apparatus that detects radiation as an electric signal. The radiographic imaging apparatus can be used in medical diagnostic equipment or nondestructive testing equipment. The term "radiation" as used herein includes electromagnetic waves, such as alpha rays, beta rays, and gamma rays, as well as X-rays.

2. Description of the Related Art

In general, an X-ray film system that has a fluorescent screen containing an X-ray phosphor layer and is coated on both sides has conventionally been used in X-ray photography. Recently, digital radiographic imaging apparatuses that include an X-ray phosphor layer and a two-dimensional photodetector (sensor panel) have widely been studied, and various patents have been applied for in relation thereto. The digital radiographic imaging apparatuses have advantages in that they have excellent image characteristics, and in that their digital data can be incorporated into a network computer system and can be shared.

In particular, a two-dimensional photodetector (hereinafter referred to as "sensor panel") that includes an amorphous silicon (a-Si) thin-film semiconductor can be used as not only a photoelectric conversion material, but also a semiconducting material for a thin-film field-effect transistor (hereinafter referred to as "TFT"). Thus, photoelectric conversion elements and TFTs, which serve as switching elements, are conveniently formed at a single time, as proposed in U.S. Pat. No. 5,793,047.

FIG. 6B is a cross-sectional view of a conventional radiographic imaging apparatus. A phosphor layer is formed on a two-dimensional sensor panel composed of a photoelectric conversion element portion in which a plurality of electrical elements, such as photosensors and TFTs, are arranged. Photoelectric conversion elements are placed on a glass substrate 100. Pixels composed of amorphous-silicon photosensors and TFTs (not shown) are arranged in two dimensions on the substrate 100 to form a pixel region 110. The substrate 100 and the pixel region 110 constitute the sensor panel. An electrical connection portion (not shown), which is connected to photosensors or TFTs and is to be connected to an external electrical circuit, is formed on the periphery of the substrate 100. The electrical connection portion is electrically connected and bonded to electrical components 150, such as tape carrier packages (hereinafter referred to as "TCPs") for driving pixels, using a binding member (not shown), such as an anisotropic conductive film, by heat press bonding. A scintillator 200, which converts X-rays into visible light, is bonded to the substrate 100 with a binder 250, such as an acrylic resin. A supporting member 300 made of a stainless steel plate (cold-rolled stainless steel plate, hereinafter referred to as "SUS") for supporting the substrate 100 is disposed under the substrate 100. The supporting member 300 is bonded to the substrate 100 with a laminating member 350, for example, made of a two-sided adhesive sheet composed of a binder (for example, a silicon resin binder or an acrylic resin binder) and a foam (for example, a urethane foam or an acrylic foam). These components constitute the radiographic imaging apparatus.

In a manufacturing process or an inspection process of the radiographic imaging apparatus, during an in-process inspection or a screening test after the substrate 100 is fixed on the supporting member 300, if a malfunction or a defect is found in the electrical components 150, such as the TCPs, which are placed on the periphery of the substrate 100 and are connected to the substrate 100, the defective component may be replaced with a new electrical component. In conventional radiographic imaging apparatuses, however, the laminating member 350 under the substrate 100 having the electrical components 150 thereon is soft and therefore uniform bonding between the substrate 100 and the supporting member 300 is hard to achieve at high temperature and high pressure. Thus, the replacement of a defective component is difficult. That is, deformation of the laminating member 350 caused by high temperature and high pressure during bonding causes the electrical connection portion of the substrate 100, which is to be electrically connected to a new electrical component, to deviate from a heater head of a bonding apparatus opposite to the electrical connection portion of the substrate 100. This deviation prevents the heater head from uniformly pressing the electrical connection portion of the substrate 100.

SUMMARY OF THE INVENTION

Accordingly, the present invention provides a radiographic imaging apparatus in which the connection and the replacement of an electrical component can be performed even after a substrate, which includes a pixel region including pixels composed of photosensors and TFTs arranged in two dimensions, is fixed on a supporting member.

A semiconductor device according to the present invention comprises a substrate including a semiconductor element portion and an electrical connection portion. The semiconductor element portion includes a plurality of semiconductor elements, and the electrical connection portion is placed on the periphery of the semiconductor element portion and electrically connected to the semiconductor element portion with a wire. At least one electrical component is electrically connected to the electrical connection portion, a supporting member is bonded to the substrate with a laminating member and supports the substrate, and at least one cushioning member is disposed in at least one space between the substrate and the supporting member at least in a region including the electrical connection portion connected to the at least one electrical component.

A radiographic imaging apparatus according to the present invention comprises a substrate including a pixel unit and an electrical connection portion. The pixel unit includes a plurality of conversion elements for converting radiation into electric signals, and the electrical connection portion is placed on the periphery of the pixel unit and electrically connected to the pixel unit with a wire. At least one electrical component is electrically connected to the electrical connection portion, a supporting member that is bonded to the substrate with a laminating member and supports the substrate, and at least one cushioning member is disposed in at least one space between the substrate and the supporting member at least in a region including the electrical connection portion connected to the at least one electrical component.

The cushioning member according to the present invention may be a nonadhesive elastic body, and the space according to the present invention may be individually provided for at least one region including a plurality of electrical components. The cushioning member according to the present invention may be individually provided in the at least one space which may be provided for one electrical component.

A method for manufacturing a semiconductor device according to the present invention includes the steps of connecting at least one electrical component to a substrate via an electrical connection portion, the substrate including a semiconductor element portion including a plurality of semiconductor elements, the electrical connection portion being placed on the periphery of the semiconductor element portion on the substrate; bonding the substrate to the supporting member with a laminating member such that a space is left between the substrate and the supporting member at least in a region including the electrical connection portion connected to the at least one electrical component; and placing a cushioning member in the space.

According to the present invention, a method may also comprise the steps of removing a defective electrical component from the electrical connection portion; replacing a cushioning member under the defective electric component with a rigid member; connecting a new electrical component to the electrical connection portion on the rigid member; and replacing the rigid member with the cushioning member.

In the present invention, the substrate and the supporting member are bonded with the laminating member while a space is left between the substrate and the supporting member in a region including the electrical connection portion connected to the at least one electrical component. A cushioning member is placed in the space. This increases the impact resistance of the substrate in the region including the electrical connection portion and improves the adhesion between the electrical component and the electrical connection portion. In addition, the use of the nonadhesive elastic body as the cushioning member facilitates the removal of the cushioning member. Thus, when a defect is found in a connected electrical component, this defective electrical component can easily be replaced. Before the defective electrical component is replaced, the cushioning member is replaced with a rigid member. The rigid member increases the rigidity of the region including the electrical connection portion, thus preventing a poor connection due to the deformation of the substrate during the hot press bonding of a new electrical component. Thus, even after the substrate is fixed on the supporting member, an electrical component can be connected to the substrate, and a semiconductor device and a radiographic imaging apparatus in which a defective electrical component can be replaced are provided.

Also the cushioning member reduces vibrations of the semiconductor device or the radiographic imaging apparatus and has an impact-absorbing effect during the installation of the semiconductor device or the radiographic imaging apparatus in a medical examination vehicle. The reduction in vibrations and the impact-absorbing effect prevent adverse effects, such as a reduction in the resolution of the radiographic imaging apparatus, resulting from minute variations of the connection resistance or the wiring capacitance due to the vibrations or the impact.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

The best mode for carrying out the present invention will be described in detail below with reference to the drawings.

First Embodiment

Figure 1A:
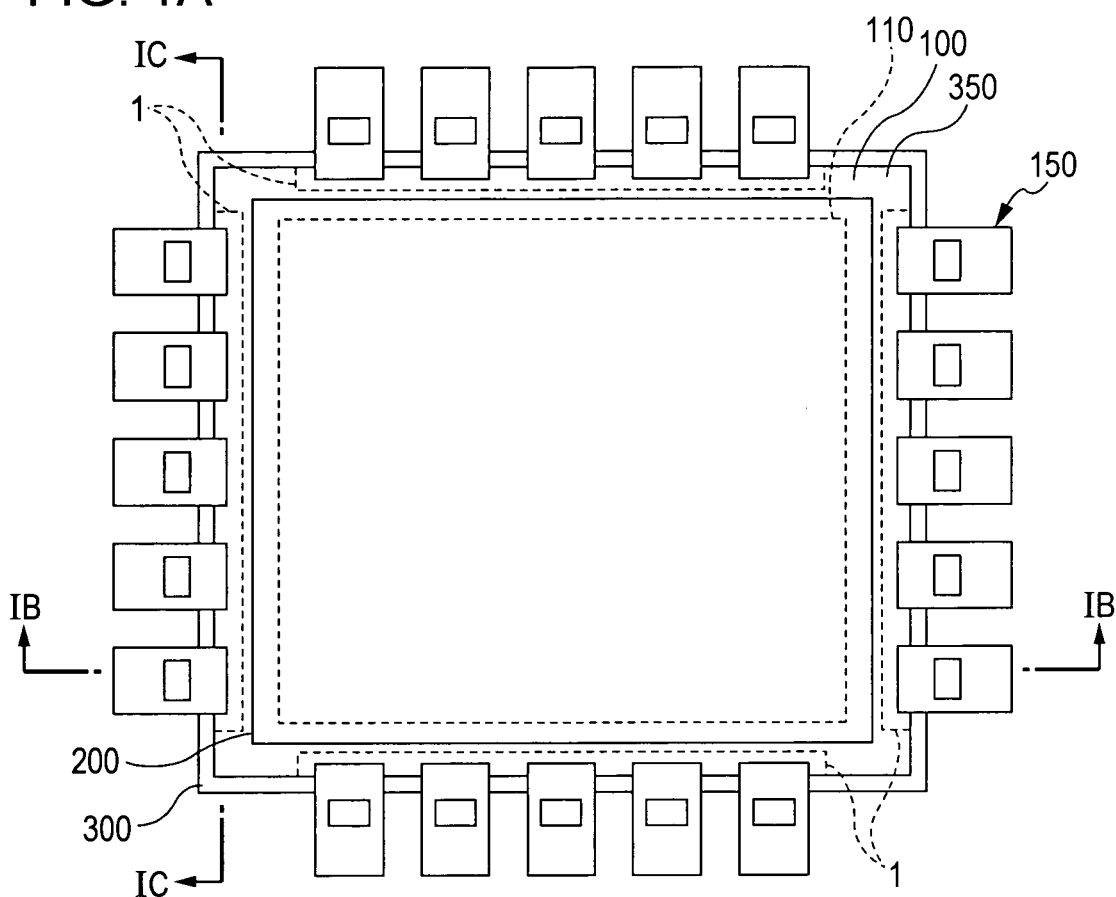
FIG. 1A is a schematic plan view of a radiographic imaging apparatus according to a first embodiment of the present invention.
Figure 1B:
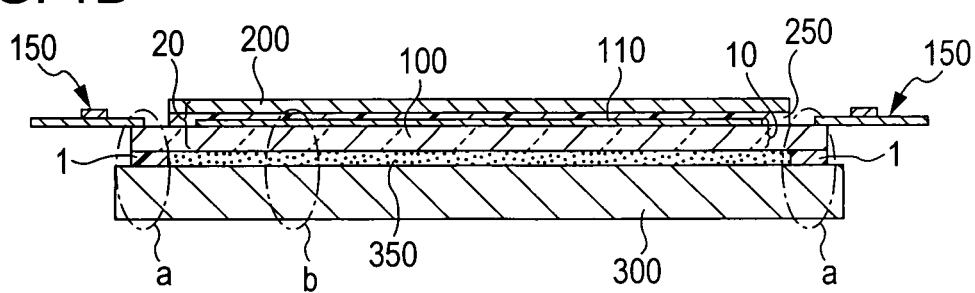
FIG. 1B is a schematic cross-sectional view taken along the line IB-IB of FIG. 1A.
Figure 1C:
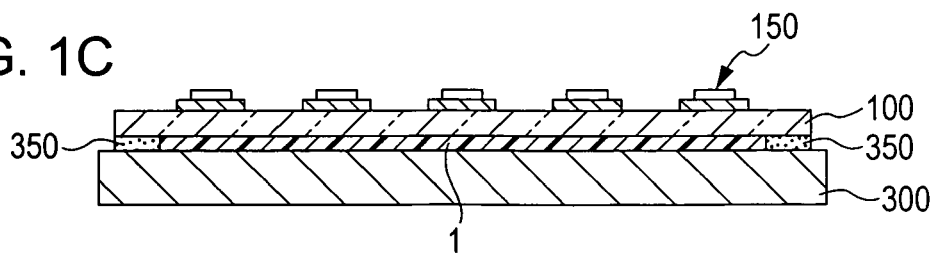
FIG. 1C is a schematic cross-sectional view taken along the line IC-IC of FIG. 1A.

FIG. 1A is a schematic plan view of a radiographic imaging apparatus according to this embodiment; FIG. 1B is a schematic cross-sectional view taken along the line IB-IB of FIG. 1A; and FIG. 1C is a schematic cross-sectional view taken along the line IC-IC of FIG. 1A.

A pixel unit 110 is placed on a glass substrate 100. The pixel unit 110 includes pixels arranged in two dimensions. Each pixel is composed of a conversion element for converting radiation or light into electric signals and a signal transfer element, such as TFT. A drive wire for driving signal transfer means, a signal wire for reading the electric signals that have been converted in the conversion element and transferred by the signal transfer means, a bias wire for biasing the conversion element, and an electrical connection portion for connecting these wires to an external circuit are provided on the periphery of the pixel unit 110 on the substrate 100. The substrate 100, the pixel unit 110, the drive wire, the signal wire, the bias wire, and the electrical connection portion constitute a sensor panel 10. The conversion element may be made of amorphous selenium (a-Se) that directly converts radiation into electric signals, or may be a photosensor (photoelectric conversion element) for converting light that is converted from radiation with a scintillator described below into electric signals. The photosensor may be a photodiode or a photocondenser made of amorphous silicon. The pixel unit 110, the drive wire, the signal wire, and the bias wire may be coated with a protective layer of an inorganic film made of $SiO_2$ or SiN. Furthermore, the protective layer may be coated with a passivation film of an organic film made of polyimide to obtain the sensor panel with a flat surface.

Electrical components 150, such as TCPs, are electrically connected to the electrical connection portion of the substrate 100. The electrical components 150 include a drive circuit for driving a pixel or a signal processing circuit for amplifying an electric signal read from the pixel. The electrical components 150 electrically connect connecting electrodes (not shown) of the electrical components 150 with a connecting electrode (not shown) of the electrical connection portion on the periphery of the substrate 100 using a binding member (not shown), such as an anisotropic conductive film. The electrical components 150 are mechanically fixed on the substrate 100 with the binding member. Each electrical component 150 is connected to an electrical circuit board (not shown), such as a printed circuit board, on a side of the electrical component 150 far from the substrate 100.

A scintillator (wavelength converter) 200 converts radiation into visible light. The scintillator 200 is placed over a surface containing the pixel unit 110 on the substrate 100 (the surface through which radiation, such as X-rays, passes). In the present embodiment, the scintillator 200 is fixed on the surface containing the pixel unit 110 on the substrate 100 with a binder 250, such as an acrylic resin. In the scintillator 200, a phosphor layer may be bonded to a base material, such as polyethylene terephthalate (PET), with the binder 250. The phosphor layer may be formed by applying a phosphor powder having a particle crystal structure, such as $Gd_2O_2S$ (hereinafter referred to as "GOS"), to a binder resin, such as a polyester, and then curing it. In the scintillator 200, another phosphor layer having a columnar crystal structure of an alkali halide, such as thallium-activated cesium iodide (hereinafter referred to as "CsI:Tl"), may be bonded to a base material, such as amorphous carbon (hereinafter referred to as "a-C"), with the binder 250. Furthermore, a phosphor layer having a columnar crystal structure of an alkali halide, such as CsI:Tl, may directly be formed on the surface containing the pixel unit 110 on the substrate 100 by vapor deposition. The scintillator 200 and the sensor panel 10 constitute a radiation image pickup panel 20.

A supporting member 300 is placed on a surface of the substrate 100 opposite to the surface containing the pixel unit 110 and supports the substrate 100. The supporting member 300 may be composed of a metallic material, such as stainless steel (SUS), Al, or Mo; glass; or a ceramic, and is bonded to the substrate 100 with a laminating member 350 described below.

The laminating member 350 is placed between the substrate 100 and the supporting member 300 to bond them. The laminating member 350 according to the present embodiment is composed of a two-sided adhesive acrylic foam sheet and a resin binder, such as a silicone resin. The laminating member 350 may be a two-sided adhesive tape in which an acrylic foam base material is coated with an acrylic adhesive at both sides, such as an acrylic foam tape Y-4989 (trade name, Sumitomo 3M Ltd.). The laminating member 350 according to the present invention is placed between a region including at least the electrical connection portion electrically connected to the electrical components 150 on the substrate 100 and the supporting member 300 while a space is left between the region and the supporting member 300.

Cushioning members 1 are placed in spaces left between the region including at least the electrical connection portion on the substrate 100 and the supporting member 300. The cushioning members 1 may be nonadhesive elastic sheets made of an acrylic resin, a urethane resin, a polyethylene resin, a silicone resin, a polyolefin resin, an acrylonitrile-butadiene resin, a chloroprene resin, or an ethylene-propylene resin. The cushioning members 1 may be foams made of the resin described above. The term "nonadhesive elastic" as used herein means that a material has no adhesive layer, is made of a nonadhesive resin, and is free from a tackifier, such as rosin and derivatives thereof, a polyterpene resin, or a xylene resin. The cushioning members 1 may be sheets or foam sheets made of the resin described above.

The radiographic imaging apparatus according to the present invention will be described in detail below.

Pixels composed of amorphous-silicon photosensors and TFTs are arranged in two dimensions in the pixel unit 110 on the glass substrate 100. A drive wire for driving a TFT, a signal wire for reading the electric signals that have been converted with the photosensor and transferred with the TFT, a bias wire for biasing the photosensor, and an electrical connection portion for connecting these wires to an external circuit are provided on the periphery of the pixel unit 110 on the substrate 100. Furthermore, the pixel unit 110, the drive wire, the signal wire, and the bias wire on the substrate 100 are covered with a protective film made of $SiN_x$ (not shown), except for a region in which the electrical connection portion is formed. The substrate 100, the pixel unit 110, the drive wire, the signal wire, the bias wire, the electrical connection portion, and the protective film constitute the sensor panel 10.

The electrical components 150 of TCPs are connected to the electrical connection portion on the periphery of the substrate 100.

The scintillator 200, which has been formed by applying a binder containing GOS to PET, is fixed on the pixel unit 110 on the substrate 100 with an acrylic adhesive 250.

The supporting member 300 made of SUS is fixed on the bottom of the substrate 100 with the laminating member 350 of an adhesive acrylic foam sheet. The laminating member 350 is placed between a region including at least the electrical connection portion electrically connected to the electrical components 150 on the substrate 100 and the supporting member 300 while spaces are left between the region and the supporting member 300. The cushioning members 1 made of a nonadhesive elastic acrylic resin are placed in the spaces.

In the present embodiment, the cushioning members 1 are individually provided for each side of the substrate 100. Each of the cushioning members 1 is placed under a plurality of electrical components 150 on each side.

Next, a method for manufacturing a radiographic imaging apparatus according to the present invention will be described in detail below with reference to FIG. 2A to FIG. 2D.

Figure 2A:
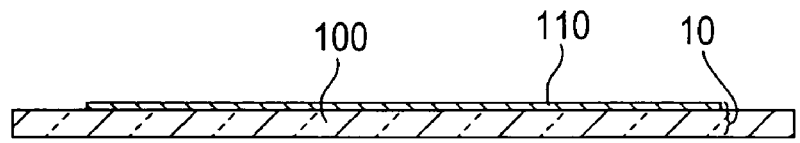
FIG. 2A is a first schematic cross-sectional view showing a method for manufacturing a radiation detector according to the first embodiment of the present invention.

As shown in FIG. 2A, pixels composed of amorphous silicon photosensors and TFTs are arranged in two dimensions on a glass substrate 100 to form a pixel unit 110. A drive wire for driving a TFT, a signal wire for reading the electric signals that have been converted with the photosensor and transferred with the TFT, a bias wire for biasing the photosensor, and an electrical connection portion for connecting these wires to an external circuit are formed on the periphery of the pixel unit 110 on the substrate 100. Furthermore, the pixel unit 110, the drive wire, the signal wire, and the bias wire on the substrate 100 are covered with a protective coat made of $SiN_x$ (not shown), except for a region in which the electrical connection portion is placed. These components are manufactured in a thin-film semiconductor process, thus forming the sensor panel 10.

Figure 2B:
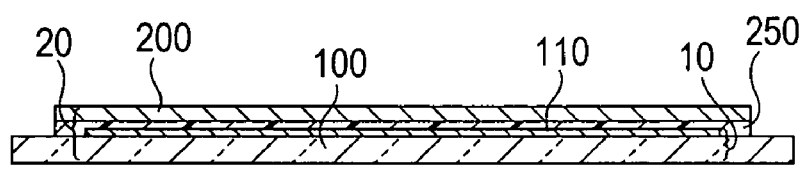
FIG. 2B is a second schematic cross-sectional view showing the method for manufacturing the radiation detector according to the first embodiment of the present invention.

Then, as shown in FIG. 2B, a scintillator 200, which has been formed by applying a binder containing phosphor particles to a base material, such as PET, is bonded to the pixel unit 110 on the substrate 100 with an acrylic adhesive 250 to form a radiation image pickup panel 20.

Figure 2C:
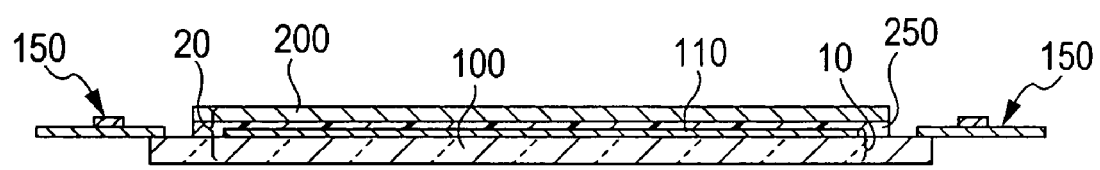
FIG. 2C is a third schematic cross-sectional view showing the method for manufacturing the radiation detector according to the first embodiment of the present invention.

Then, as shown in FIG. 2C, electrical components 150 having a connecting electrode opposite to the electrical connection portion are mechanically and electrically bonded to the electrical connection portion on the periphery of the substrate 100 with an anisotropic conductive film by heat press bonding. In the present embodiment, the electrical components 150 are circuit boards containing a semiconductor chip, such as a TCP or a chip on flexible printed circuit board (COF). This decreases the number of connecting electrodes on the side of the electrical components 150 facing an electrical circuit board, thus making the mounting of the electrical circuit board easier. Alternatively, the electrical components 150 that do not include a semiconductor chip, such as flexible printed circuit boards, may be fixed on the electrical connection portion on the substrate 100, and a semiconductor chip may be mounted on the electrical circuit board, or a circuit having similar functions may be formed on the electrical circuit board.

Figure 2D:
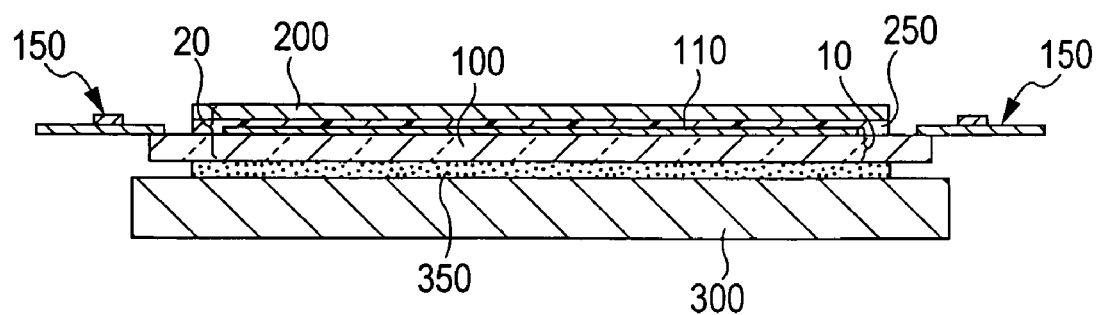
FIG. 2D is a fourth schematic cross-sectional view showing the method for manufacturing the radiation detector according to the first embodiment of the present invention.

Then, as shown in FIG. 2D, the bottom face of the sensor panel 10 connected to the electrical components 150 is bonded to the supporting member 300 made of SUS with an adhesive acrylic foam sheet having a thickness of 1 mm, which serves as the laminating member 350. In the present embodiment, spaces between the substrate 100 and the supporting member 300 at least under the electrical components 150 are not filled with the laminating member 350. The radiation image pickup panel 20 and the supporting member 300 are pressed with a planar press machine and are bonded using the laminating member 350. Then, the cushioning members 1 made of nonadhesive acrylic foam are placed in the spaces between the substrate 100 and the supporting member 300 under the electrical components 150. In this way, the radiographic imaging apparatus shown in FIG. 1A and FIG. 1B is manufactured.

In the radiographic imaging apparatus according to the present embodiment, as shown in the regions a and b in FIG. 1B, spaces between the substrate 100 and the supporting member 300 at least under the electrical components 150 are not filled with the laminating member 350. Thus, the substrate 100 and the supporting member 300 under the electrical components 150 are not bonded. The cushioning members 1 are only placed in the spaces and can easily be removed.

A method for replacing an electrical component in the radiographic imaging apparatus according to the present invention will be described in detail below with reference to FIG. 3A to FIG. 3C. Like components are denoted by like numerals in FIG. 1 and will be explained briefly or will not be further explained.

Figure 3A:
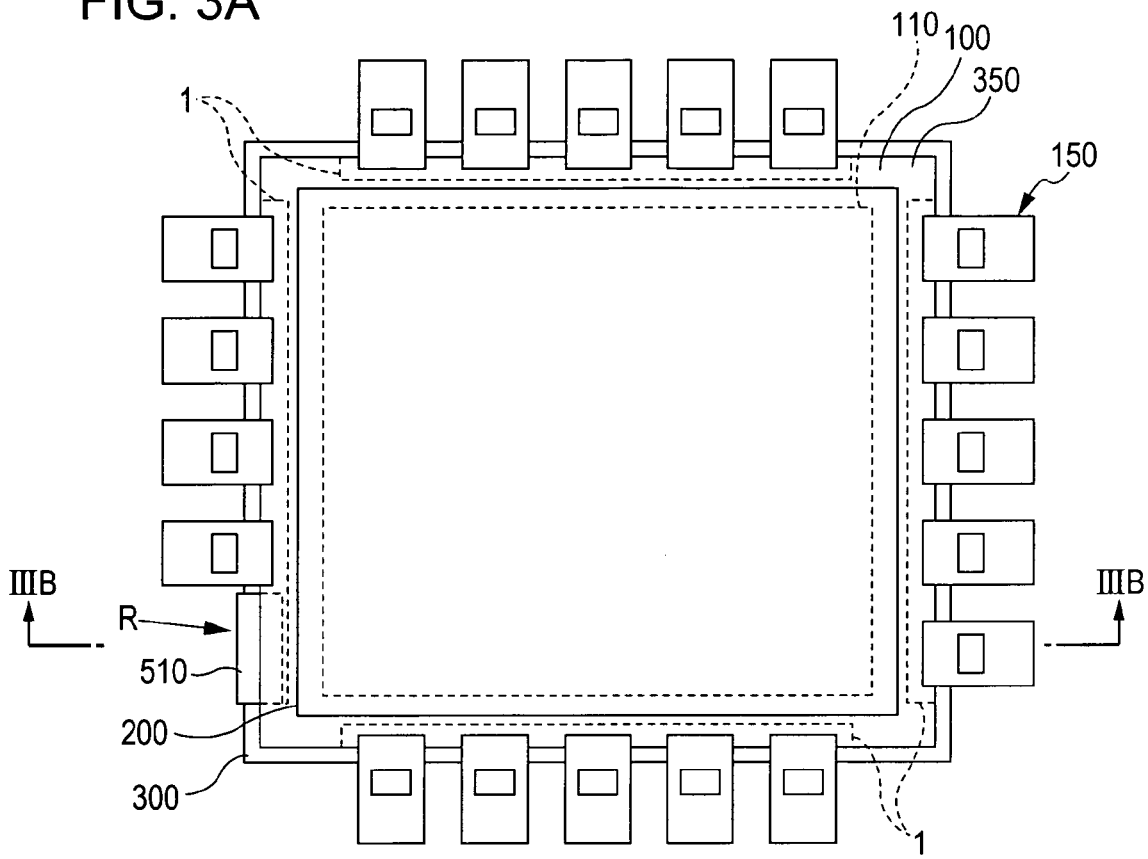
FIG. 3A is a first schematic cross-sectional view showing a method for replacing a defective electrical component of a radiographic imaging apparatus according to a first embodiment of the present invention.

FIG. 3A is a schematic plan view showing that a defective component of the electrical components 150 in the radiographic imaging apparatus shown in FIG. 1 is to be replaced. FIG. 3B is a schematic cross-sectional view taken along the line IIIB-IIIB of FIG. 3A. FIG. 3C is a schematic cross-sectional view showing a method for replacing the defective electrical component in the radiographic imaging apparatus with a new electrical component 160.

A connecting electrode 101 of the electrical connection portion on the substrate 100 is mechanically and electrically connected to a connecting electrode 161 of the new electrical component 160 with an electrically conductive adhesive made of an anisotropic conductive film. A press member 501, such as a heating head, is used to connect the new electrical component 160 to the electrical connection portion on the substrate 100. A backup stage 502 made of ceramic or glass receives the pressure during the bonding between the new electrical component 160 and the electrical connection portion on the substrate 100. The press member 501 and the backup stage 502 constitute part of a bonding apparatus. The bonding apparatus may include a heater 503 for heating the press member 501 when the new electrical component 160 is bonded to the electrical connection portion by hot pressing. A Teflon® sheet 505 is used to apply the head surface of the press member 501 uniformly to the new electrical component 160, and to prevent the anisotropic conductive film from adhering to the press member 501. In the replacing process, a rigid member 510, such as a metal spacer, is placed in the space and prevents the region including the electrical connection portion on the substrate 100 from being mechanically broken by the applied bonding pressure.

In the method for replacing a defective electrical component according to the present embodiment, for purposes of description, only one of the electrical components 150 is replaced. However, the number of the electrical components to be replaced is not limited to one. That is, the same procedure as described herein can be repeated to replace a plurality of defective electrical components.

The method for replacing a defective electrical component in the radiographic imaging apparatus according to the present invention will be described below with reference to FIG. 3A to FIG. 3C. As shown in FIG. 3A, one of the electrical components 150 has a defect at the position R.

Figure 3B:
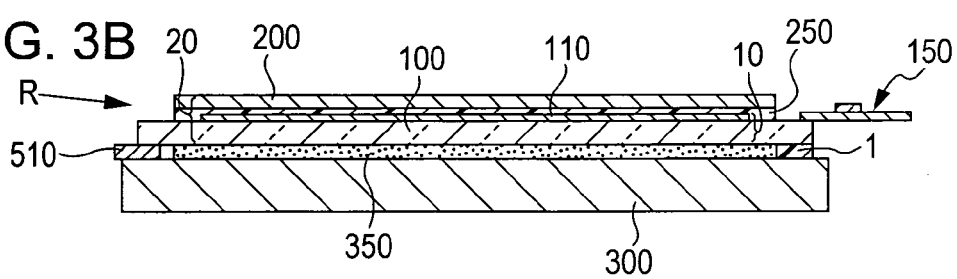
FIG. 3B is a second schematic cross-sectional view showing a method for replacing the defective electrical component of the radiographic imaging apparatus according to the first embodiment of the present invention.

First, as shown in FIG. 3A and FIG. 3B, the defective electrical component at the position R is removed from the electrical connection portion on the substrate 100. Then, the anisotropic conductive film left on the substrate 100 is removed with a solvent, such as acetone or methyl ethyl ketone (MEK). A cushioning member 1 between the substrate 100 and the supporting member 300 improves the impact resistance during the removal of the defective electrical component. Then, the cushioning member 1 at the position R is replaced with a metal spacer 510 made of SUS having the same thickness as the distance between the substrate 100 and the supporting member 300. The metal spacer 510 may be selected from metal spacers having different thicknesses to conform to the space between the substrate 100 and the supporting member 300. Alternatively, the metal spacer 510 may be composed of a plurality of metal plates. After these processes, the defective electrical component in the radiographic imaging apparatus is ready to replace with a new electrical component 160.

Then, the alignment of the opposite surfaces of the substrate 100 and the press member 501 is checked and is adjusted if required. A new anisotropic conductive film is applied to the connecting electrode 101 of the electrical connection portion on the substrate 100 by heat press bonding.

Figure 3C:
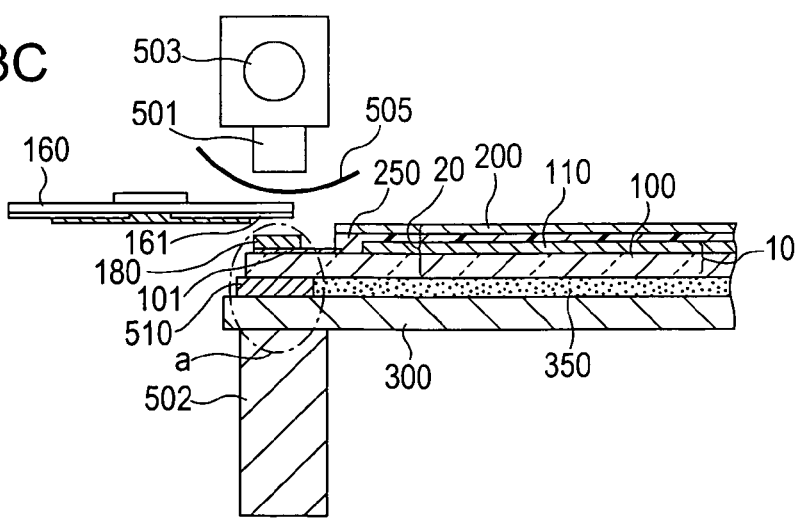
FIG. 3C is a third schematic cross-sectional view showing a method for replacing the defective electrical component of the radiographic imaging apparatus according to the first embodiment of the present invention.

Then, as shown in FIG. 3C, the press member 501 is placed over the connecting electrode 101 and the backup stage 502 is placed under the connecting electrode 101. The connecting electrode 101 on the substrate 100 and the connecting electrode 161 of the new electrical component 160 are aligned to face each other and are temporarily fixed. The term "temporarily fix" means that an object is held by tackiness of the anisotropic conductive film, adsorption to a stage for adjusting a wiring member, or mechanical pressure.

After the temporal fix, the press member 501 is moved down to bond the connecting electrode 161 of the new electrical component 160 to the connecting electrode 101 of the substrate 100 by heat press bonding at a desired temperature and pressure. At the same time, the two electrodes are electrically connected. For example, the bonding conditions are as follows: effective temperature=170° C., pressure=2.5 MPa, and bonding time=15 s.

After the new electrical component 160 has been connected, the metal spacer 510 between the substrate 100 and the supporting member 300 is replaced with the cushioning member 1. In this way, the defective electrical component in the radiographic imaging apparatus is replaced with the new electrical component 160.

In the replacement of an electrical component in the radiographic imaging apparatus according to the present embodiment, the rigid member 510, such as a metal spacer, can easily be placed between the substrate 100 and the supporting member 300. The rigid member 510 prevents the press member 501 from becoming misaligned with the substrate 100 during the bonding, and also avoids a resulting poor connection between the connecting electrode 101 of the electrical connection portion on the substrate 100 and the connecting electrode 161 of the new electrical component 160.

Second Embodiment

Figure 4A:
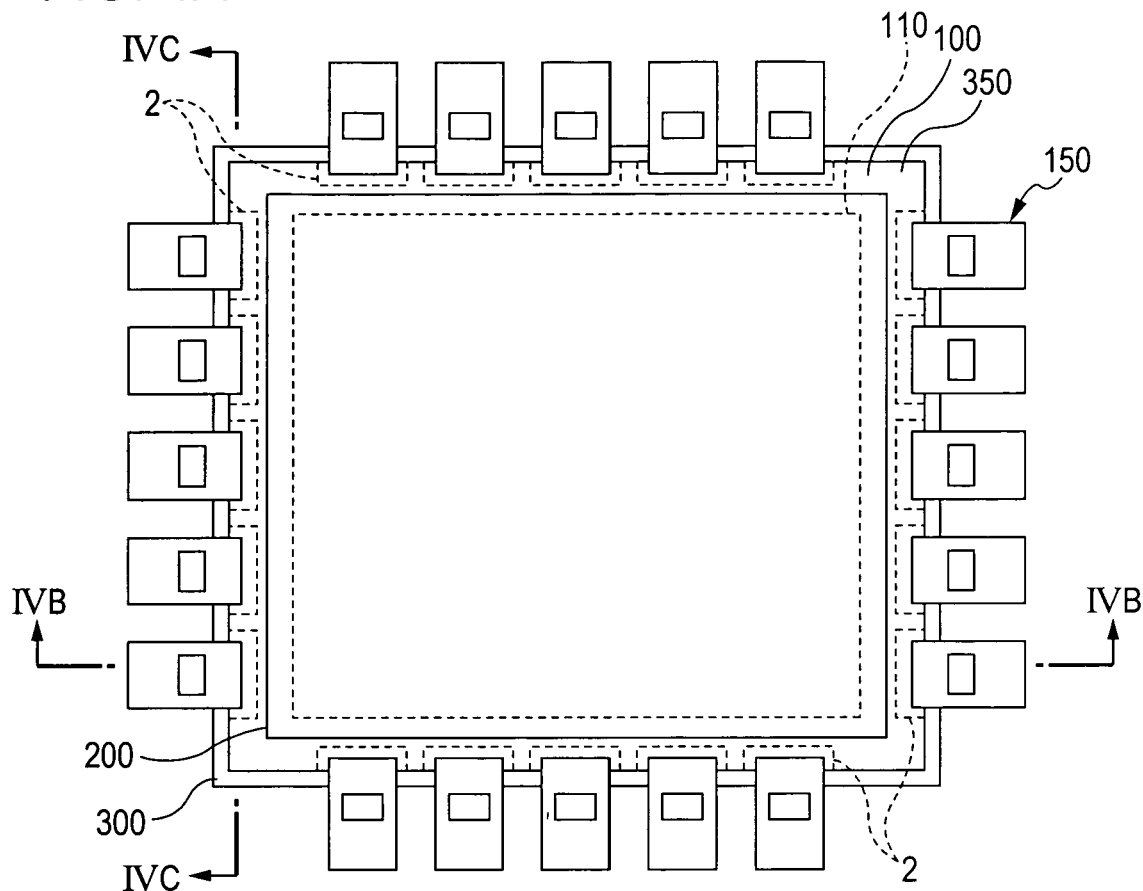
FIG. 4A is a schematic plan view of a radiographic imaging apparatus according to a second embodiment of the present invention.
Figure 4B:
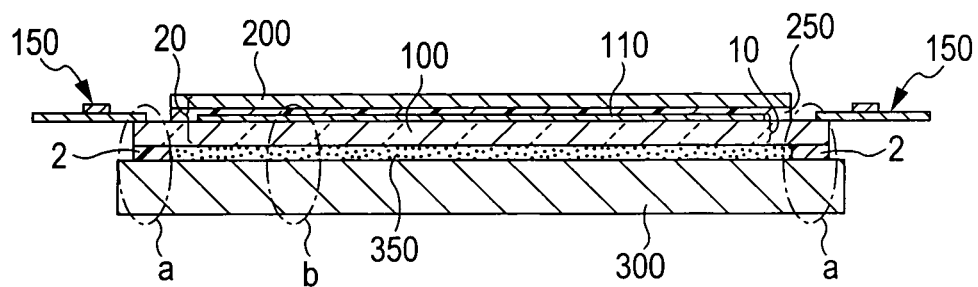
FIG. 4B is a schematic cross-sectional view taken along the line IVB-IVB of FIG. 4A.
Figure 4C:
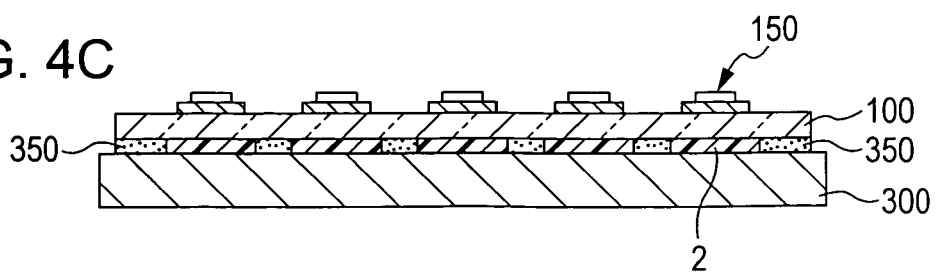
FIG. 4C is a schematic cross-sectional view taken along the line IVC-IVC of FIG. 4A.

FIG. 4A to FIG. 4C are schematic views of a radiographic imaging apparatus according to a second embodiment. FIG. 4A is a schematic plan view of the radiographic imaging apparatus according to the second embodiment; FIG. 4B is a schematic cross-sectional view taken along the line IVB-IVB of FIG. 4A; and FIG. 4C is a schematic cross-sectional view taken along the line IVC-IVC of FIG. 4A. Like components are denoted by like numerals in the first embodiment and will be explained briefly or will not be further explained.

In the second embodiment, as in the first embodiment, a pixel unit 110, a drive wire, a signal wire, a bias wire, and an electrical connection portion are placed on a glass substrate 100. The substrate 100, the pixel unit 110, the drive wire, the signal wire, the bias wire, and the electrical connection portion constitute a sensor panel 10. Electrical components 150 of TCPs are connected to the electrical connection portion on the periphery of the substrate 100. A scintillator 200, which is formed by applying a binder containing GOS to PET, is fixed on the pixel unit 110 on the substrate 100 with an acrylic adhesive 250. A supporting member 300 made of SUS is fixed on the bottom of the substrate 100 with a laminating member 350 of an adhesive acrylic foam sheet. The laminating member 350 is placed between a region including at least the electrical connection portion electrically connected to the electrical components 150 on the substrate 100 and the supporting member 300 while spaces are left between the region on the substrate 100 and the supporting member 300. Cushioning members 2 made of a nonadhesive elastic acrylic resin are placed in the spaces.

In the present embodiment, the spaces between the substrate 100 and the supporting member 300 are individually provided for discrete regions to which the electrical components 150 on the substrate 100 are connected. The cushioning members 2 are individually placed in the discrete spaces under the electrical components 150.

In the present embodiment, a defective electrical component can be replaced in the same way as in the first embodiment shown in FIG. 3A to 3C.

In the radiographic imaging apparatus according to the present embodiment, the cushioning members 2 are provided for the respective electrical components 150 and are not bonded to the substrate 100 or the supporting member 300. Thus, the cushioning members 2 can easily be removed in the replacement of the defective electrical component. This improves the workability. In addition, since the size of the cushioning members 2 is smaller than that of the cushioning members 1, which are individually provided for each side of the substrate 100, the replacement can be performed at lower cost.

Third Embodiment

Figure 5:
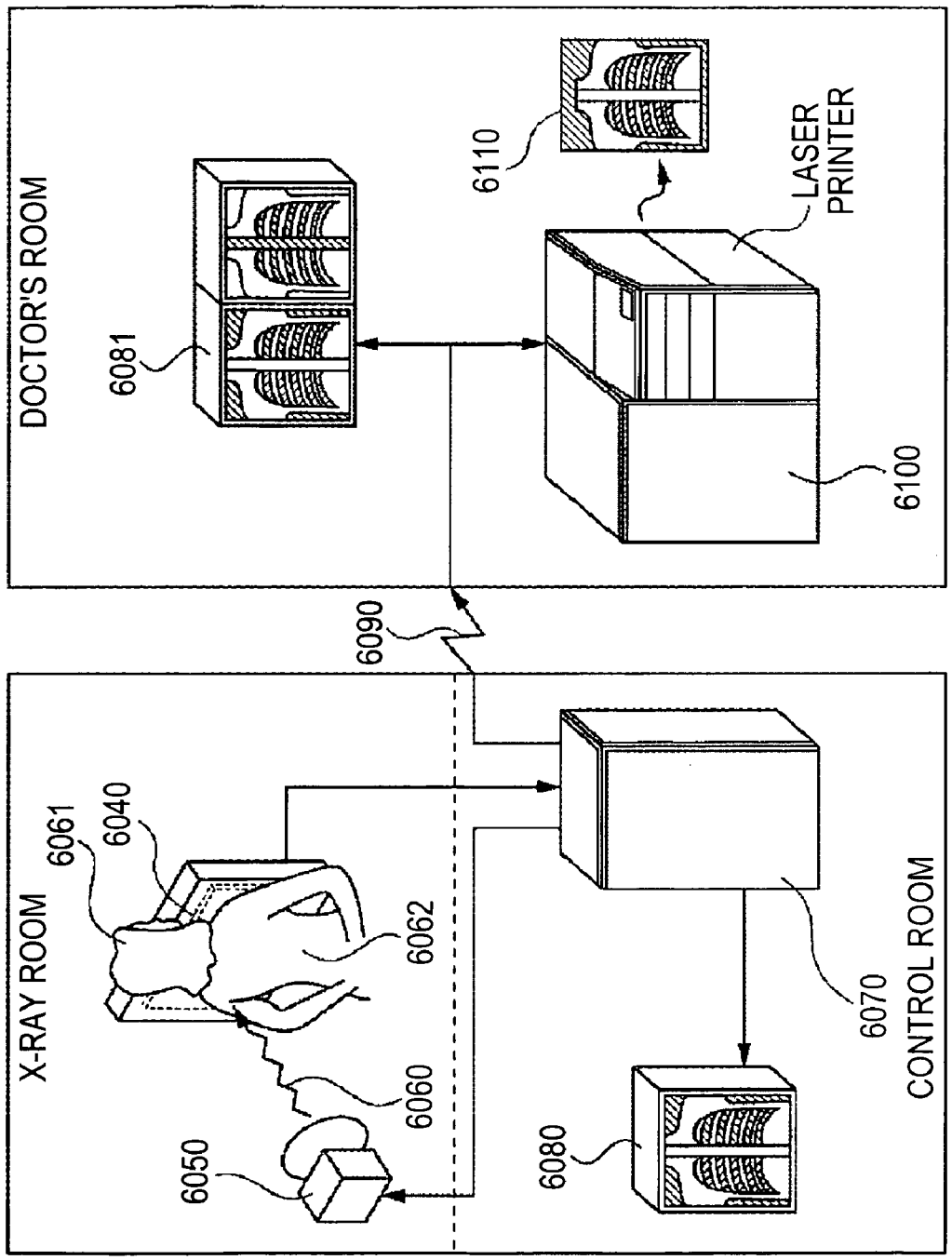
FIG. 5 is a conceptual diagram of a radiation photographing system according to an application of the present invention.
Figure 6A:
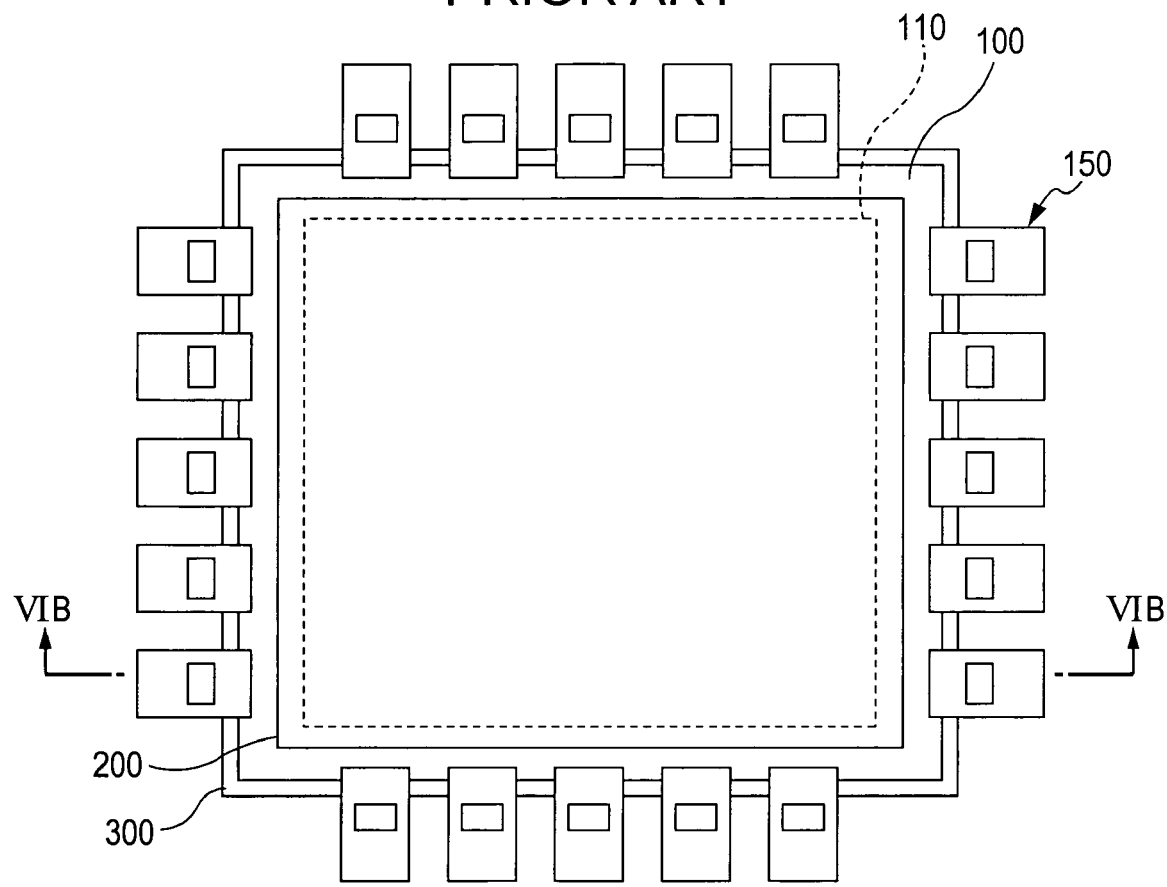
FIG. 6A is a schematic plan view of a conventional radiographic imaging apparatus.
Figure 6B:
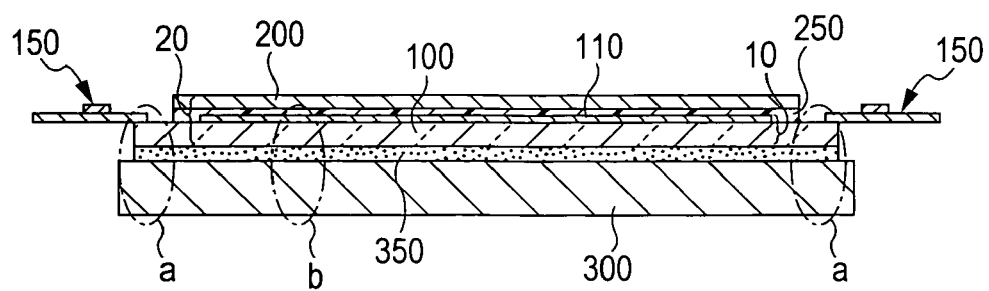
FIG. 6B is a schematic cross-sectional view taken along the line VIB-VIB of FIG. 6A.

The application of the radiographic imaging apparatus according to the present invention to an X-ray diagnosis system will be described below with reference to FIG. 5.

X-rays 6060 generated by an X-ray tube 6050 pass through a chest 6062 of a patient 6061 and enter a radiographic imaging apparatus (image sensor) 6040 as shown in FIG. 3. The incident X-rays contain information on the interior of the body of the patient 6061. The incident X-rays cause a scintillator (phosphor layer) to emit light, which is photoelectrically converted by photoelectric conversion elements in a sensor panel into electrical information. This electrical information is converted into digital data, which are subjected to image processing in an image processor 6070, which serves as signal processing means, and is visualized on a display 6080, which serves as displaying means, in a control room.

The electrical information can also be transferred to a remote place with transmission means, such as a telephone line 6090, and can be visualized on a display 6081, which serves as displaying means, in a remote doctor's room or can be stored on recording means, such as an optical disk. Thus, a doctor in a remote place can make a diagnosis. The electrical information can also be recorded on a film 6110 with a film processor 6100, which serves as recording means.

As many apparently widely different embodiments of the present invention can be made without departing from the spirit and scope thereof, it is to be understood that the invention is not limited to the specific embodiments thereof except as defined in the claims.

This application claims priority from Japanese Patent Application No. 2004-338929 filed on Nov. 24, 2004, which is hereby incorporated by reference herein.

What is claimed is:

1. A semiconductor device comprising:
   a substrate including a semiconductor element portion and an electrical connection portion, the semiconductor element portion including a plurality of semiconductor elements, and the electrical connection portion being placed on the periphery of the semiconductor element portion and electrically connected to the semiconductor element portion with a wire;
   at least one electrical component electrically connected to the electrical connection portion;
   a supporting member that is bonded and fixed to the substrate with a laminating member and supports the substrate, the laminating member being disposed in a region of the substrate corresponding to the semiconductor element portion; and
   at least one cushioning member made of resin removably placed in at least one space between the substrate and the supporting member at least in a region including the electrical connection portion connected to the at least one electrical component, wherein the at least one cushioning member is a nonadhesive elastic body.

2. The semiconductor device according to claim 1, wherein the at least one cushioning member is made of at least one of the following: acrylic resin, urethane resin, polyolefin resin, acrylonitrile-butadiene resin, chloroprene resin and ethylene-propylene resin.

3. The semiconductor device according to claim 1, wherein the at least one cushioning member is a resin foam.

4. The semiconductor device according to claim 1, wherein the at least one cushioning member is a sheet made of resin.

5. The semiconductor device according to claim 1, wherein the at least one cushioning member is a foam sheet made of resin.

6. The semiconductor device according to claim 1, wherein the at least one electrical component is connected to the electrical connection portion with an electrically conductive adhesive.

7. The semiconductor device according to claim 1, wherein the at least one space is provided for at least one region including a plurality of electrical components, and the at least one cushioning member is placed in the at least one space.

8. The semiconductor device according to claim 1, wherein the at least one cushioning member is individually placed in at least one space provided for one electrical component.

9. The semiconductor device according to claim 1, wherein the substrate is a glass substrate and the plurality of semiconductor elements are disposed on the glass substrate.

10. A semiconductor device comprising:

a substrate including a semiconductor element portion and an electrical connection portion, the semiconductor element portion including a plurality of semiconductor elements, and the electrical connection portion being placed on the periphery of the semiconductor element portion and electrically connected to the semiconductor element portion with a wire;

at least one electrical component electrically connected to the electrical connection portion;

a supporting member that is bonded and fixed to the substrate with a laminating member and supports the substrate, the laminating member being disposed in a region of the substrate corresponding to the semiconductor element portion; and at least one cushioning member made of resin placed in at least one space between the substrate and the supporting member at least in a region including the electrical connection portion connected to the at least one electrical component, wherein the at least one cushioning member is a nonadhesive elastic body which is bonded neither to the substrate nor to the supporting member.

11. A semiconductor device according to claim 1, wherein the at least one cushioning member is removable when the at least one electrical component is replaced.

12. A semiconductor device according to claim 10, wherein the at least one cushioning member is removable when the at least one electrical component is replaced.

* * * * *